United States Patent [19]
Eda et al.

[11] Patent Number: 4,930,044
[45] Date of Patent: May 29, 1990

[54] THIN-FILM CAPACITOR AND METHOD OF MANUFACTURING A HYBRID MICROWAVE INTEGRATED CIRCUIT

[75] Inventors: Kazuo Eda, Nara; Tetsuji Miwa, Neyagawa; Yutaka Taguchi, Kadoma, all of Japan

[73] Assignee: Matsushita Electric Industrial Co., Ltd., Osaka, Japan

[21] Appl. No.: 398,731

[22] Filed: Aug. 25, 1989

[30] Foreign Application Priority Data

Aug. 25, 1988 [JP] Japan ............................. 63-211005
Mar. 31, 1989 [JP] Japan ................................. 1-83401

[51] Int. Cl.⁵ .......................... H01G 4/06; H01G 7/00
[52] U.S. Cl. ................................... 361/313; 29/25.42
[58] Field of Search ..................... 29/25.42; 427/79; 361/311–313

[56] References Cited

U.S. PATENT DOCUMENTS

3,679,942  7/1972  Daly ........................... 29/25.42 X
4,437,139  3/1984  Howard ........................... 361/313

FOREIGN PATENT DOCUMENTS

47-17965  9/1972  Japan.
63-49385  10/1988  Japan.

Primary Examiner—Donald A. Griffin
Attorney, Agent, or Firm—Wenderoth, Lind & Ponack

[57] ABSTRACT

A thin-film capacitor which has excellent withstand voltage characteristic, dielectric loss characteristic and production yield can be obtained by forming its dielectric film with a 3-layered structure comprising a first silicon oxide film formed on a polycrystalline sintered body substrate by a chemical vapor-phase deposition method, a second silicon oxide film formed by coating on the first silicon oxide film a solution state silicon oxide precursor followed by denaturing by heat treatment, and a third silicon oxide film formed on the second silicon oxide film by a chemical vapor-phase deposition method. A hybrid microwave integrated circuit is manufactured in which the above-mentioned thin-film capacitors are used as input/output coupling and DC blocking capacitors, bypass capacitors and impedance matching capacitors.

12 Claims, 4 Drawing Sheets

THIN-FILM CAPACITOR AND METHOD OF MANUFACTURING A HYBRID MICROWAVE INTEGRATED CIRCUIT

BACKGROUND OF THE INVENTION

1. Field of the Invention

The present invention relates to a thin-film capacitor to be used for a hybrid microwave integrated circuit and to a method of manufacturing a hybrid microwave integrated circuit using the thin film capacitor.

2. Description of the Prior Art

In the field of telecommunication, it is a tendency to make the signal frequency higher and higher, and especially in the field of satellite communication, the signal frequency will be made 10 GHz or higher. Being accompanied by such a tendency, miniaturization of equipment or devices to be used in such a higher frequency band is needed. In the same way, a low cost integrated circuit having good characteristics in a microwave band is strongly needed.

A hybrid microwave integrated circuit or a monolithic microwave integrated circuit has been used as a microwave integrated circuit for amplifying or modulating an electric signal in the microwave band of 10 GHz to 30 GHz. The hybrid microwave integrated circuit is constituted with transistors, resistors and capacitors which are mounted on a substrate. The constitution and the manufacturing method of a typical microwave hybrid integrated circuit are disclosed in M. Caulton, "Microwave Integrated-Circuit Technology - A Survey", IEEE Journal of Solid State Circuits, Vol. sc-5, No. 6, pp. 292–303 (1970). In this case, thin-film resistors of tantalum nitride and thin-film capacitors of silicon oxide are integrated on a single-crystalline substrate of sapphire etc. In hybrid microwave integrated circuits which are actually used at present, in most cases, thin-film capacitors are not used and chip capacitors are used. The reason that the chip capacitor is used in a hybrid microwave integrated circuit instead of the thin-film capacitor is mainly the restriction required by the substrate. Usually an alumina substrate is used as the substrate, which has low loss in a microwave band, a proper value of dielectric constant, an excellent resisting property against heat and chemicals and is low in cost. The alumina substrate has excellent electric properties and is low in cost, but since it is a polycrystalline sintered body, the occurrence of defects on the surface of it cannot be avoided. Even after mirror finish, there are many large surface defects, and the surface is not smooth or flat enough to form thereon a thin-film capacitor. If a sapphire single-crystalline substrate is used the surface is very smooth and flat, so that a thin film capacitor can be formed, but its cost is as high as ten times that of an alumina substrate. From the economical point of view, the sapphire substrate is not preferable.

As a method of solving the problem, are is a well known method in which the surface of an alumina substrate is covered with a vitreous film of 2 or 3 μm to make the surface flat and smooth, and thin-film resistors and thin-film capacitors are formed on it. The vitreous film is inferior in heat and chemical resistivity to the alumina substrate, which restricts an integrating process. For example, tantalum nitride is often used as a thin-film resistor for its high reliability, and an etchant of hydrofluoric acid series is usually used for the etching of tantalum nitride. The vitreous film is generally affected by chemicals of hydrofluoric acid series, so that if a substrate with a vitreous film is used it becomes difficult to integrate a thin-film resistor using a tantalum nitride. By using a dry etching method in which fluid etchant is not used, etching can be performed without giving damage to the substrate. However, the device for dry etching is expensive and the process lacks in productivity compared with the wet etching.

Because of the reasons as mentioned in the above, an alumina substrate and chip capacitors are generally used in the hybrid microwave integrated circuit. In the case cf this constitution, the number of parts is increased, and the joining joints by wire bonding or by an adhesive are increased. This inevitably increases manufacturing processes and causes cost increase, which degrades the degree of integration. The joining points by wire bonding or by adhesives are weak against mechanical vibrations or temperature changes, which can cause degradation of reliability. The connection by wire bonding causes parasitic reactance which degrades high frequency characteristics.

The monolithic microwave integrating circuit is constituted on a substrate of silicon or GaAs etc. on which active elements such as transistors and various kinds of passive parts are integrated. It is suited to mass production in comparison with the hybrid microwave integrating circuit, but it has drawbacks such as large substrate loss, poor heat discharge characteristic, difficulty in adjustment. Therefore, the hybrid microwave integrated circuit and the monolithic microwave circuit are used selectively in proper way depending on the usage.

The hybrid microwave integrated circuit is often used in the case where impedance matching is difficult, low loss is needed and good heat dissipation is needed, as in the case of a solid state power amplifier.

As a thin-film capacitor to be used for an integrated circuit many kinds of materials, manufacturing methods and structures are proposed and actually being used. A typical thin-film capacitor and its manufacturing method and disclosed in U.S. Pat. No. 3,679,942(Metal-Oxide-Metal, Thin-Film Capacitors and Method of Making Same", issued on June 25, 1972 by Daly). In this method, silane ($SiH_4$) is chemically reacted with oxygen to make silicon oxide and it is deposited on a single-crystalline crystalline substrate of sapphire, magnesium-aluminate spinel or silicon. It is a method so called a chemical vapor-phase deposition method. The specification of this patent describes that the silicon oxide thus formed is improved much in its dielectric loss characteristic by heat treatment for more than six hours at a temperature of 395–425° C. With this method good quality thin-film capacitors can be manufactured with good yield when a single crystalline substrate which has a flat and smooth surface is used, but when a ceramic substrate such as an alumina substrate is used troubles can occur. It is because of the fact that the withstand voltage and the production yield of the thin film capacitor largely depend on the existence of defects and their sizes on the surface of the substrate.

The dielectric constant of silicon oxide is about 4, and assuming the thickness Of silicon oxide be 1 μm, the capacitance of a thin-film capacitor of 1 square mm is 35 pF. The capacitors to be used in a microwave integrated circuit are shown in the following: the capacity of a DC blocking capacitor is 1–3 pF, that of an impedance matching capacitor is 0.5–5 pF, that of a bypass capacitor is 10–100 pF. Therefore the necessary area for a thin-film capacitor is in the range of about 200 μm square to about 2 mm square. The probability that defects are caused in the part where a thin-film capacitor is formed is very high, and the short circuit between electrodes is apt to occur in this part, so that production yield and withstand voltage characteristic are much deteriorated. To increase the capacitance per unit area, when the film thickness is made thinner the area of a capacitor can be made small but withstand voltage characteristic per unit area is deteriorated. When the film thickness is increased withstand voltage characteristic per unit area is improved but the area of a capacitor has to be increased, which disturbs miniaturization and the degree of integration.

When a capacitor is made by a chemical vapor-phase deposition method, there is a limit in the film thickness to be formed. In an ordinary method when the film thickness grows more than about 2 $\mu$m fine cracks begin to occur on the film and an electric characteristic is degraded. The thickness limit is practically about 5 $\mu$m. Therefore the film thickness of silicon oxide thus formed is 1000 Å-5 $\mu$m. On the other hand, there are 2 or 3 pieces of defects per square mm which are large enough in size and depth in comparison with the film thickness of 1-5$\mu$m on the surface of an ordinary alumina substrate even after mirror finish. Such large defects as described above cannot be covered with a chemical vapor-phase deposition film, in the edge part especially the film thickness becomes extremely thin and a short circuit between electrodes is apt to occur in this part. There is a so called thick film capacitor which can be used in an integrated circuit other than the thin-film capacitor. This type of capacitor is made by a method wherein a dielectric material is mixed with a binder or a solvent to make it a paste, and a thick film is formed on a substrate with it by a method of screen printing etc and it is baked at a high temperature. A thick film obtained in this way generally has a thickness of several scores of microns and so it is called a thick film capacitor. A thick film capacitor with an excellent withstand voltage characteristic can be easily obtained but the loss in a microwave band is large. Therefore the thick film capacitor is not used in the frequency range of more than 1 GHz.

SUMMARY OF THE INVENTION

An object of the present invention is to provide a thin-film capacitor which has an excellent withstand voltage characteristic, a small dielectric loss in the high frequency range, and which can be formed with good production yield on a substrate of a polycrystalline sintered body such as an alumina substrate, and to provide a hybrid microwave integrated circuit using the thin-film capacitor.

To achieve the above-mentioned object, according to this invention, in a thin-film capacitor which comprises a lower electrode, a dielectric film and an upper electrode, the dielectric film has a three layered structure comprising a first silicon oxide film formed by a chemical vapor-phase deposition method, a second silicon oxide film formed by coating on the first silicon oxide film a solution state silicon oxide precursor followed by denaturing by heat treatment, and a third silicon oxide film formed on the second silicon oxide film by a chemical vapor-phase deposition method.

On a polycrystalline sintered body substrate, a hybrid microwave integrated circuit which has at least a DC blocking capacitor, a bypass capacitor and an impedance matching capacitor is manufactured by a method as shown in the following. Lower electrodes of capacitors are formed; a first layer of silicon oxide is made with a chemical vapor-phase deposition method; excepting an overlapping part of an edge of the lower electrode and an upper electrode of each of the DC blocking capacitor, impedance matching capacitor and bypass capacitor, the silicon oxide film is thinned by the technics of photolithography and etching; then a solution state silicon oxide precursor is coated over the above film and denatured by heat treatment to be a second silicon oxide film; a third silicon oxide film is formed by a chemical vapor-phase deposition method over the above film; the film is removed excepting the parts of the DC blocking capacitor, impedance matching capacitor and bypass capacitor by the technics of photolithography and etching; in a last step, an upper electrode of each of these capacitors is formed.

Owing to the above-mentioned constitution and the manufacturing method the following advantages can be obtained.

Utilizing a polycrystalline sintered body substrate, which is low in cost and excellent in high frequency characteristics, the following advantages can be expected.

(1) A thin-film capacitor having an excellent withstand voltage characteristic and a dielectric loss characteristic in a high frequency band can be formed with very good yield, (for example, a thin-film capacitor having a thickness of 5000 Å and an area of 600 $\mu$m $\times$ 600 $\mu$m, a withstand voltage cf more than 100 V, a dielectric loss of less than 0.001, can be obtained at a yield of more than 99%)

(2) When the thin-film capacitor is integrated as a part of a microwave integrated circuit, the production yield is improved, (for example, when 3 pieces of thin-film capacitors having the shape and the dimension as described in the above are integrated on a substrate, the production yield of 97% (0.99$^3$ $\times$ 100) or more can be obtained).

(3) Various kinds of capacitors can be formed on one substrate, so that the degree of integration and miniaturization can be improved. Owing to this the labor for assembling and adjusting caused by wire bonding is much decreased to lower the manufacturing cost; since wires are not used for connections parasitic reactance is decreased to improve high frequency characteristics (frequency band in which the circuit can be used, etc.) is improved the reliability for mechanical or thermal variation is improved with the elimination of the connecting points of chips.

(4) By the use of this manufacturing method, thin-film capacitors of different thicknesses can be integrated simultaneously without increasing the process of chemical vapor-phase deposition.

DESCRIPTION OF THE PREFERRED EMBODIMENTS

Embodiment 1

Figure 1:
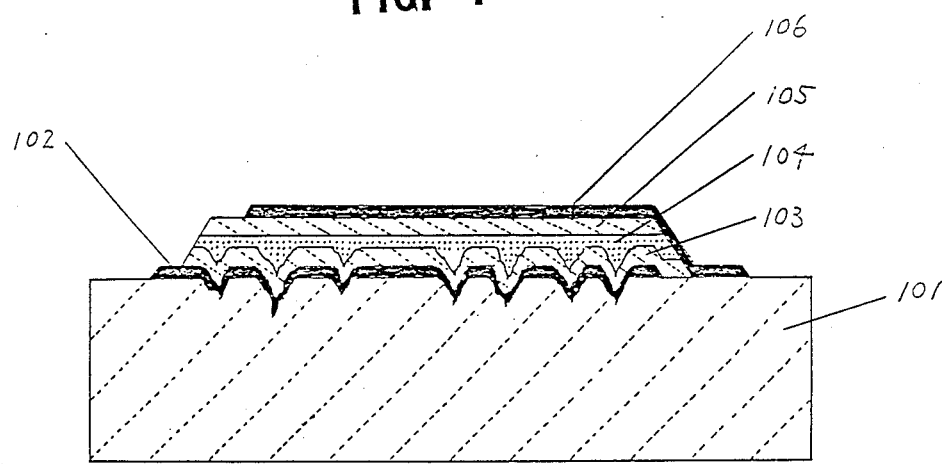
FIG. 1 is a structural drawing showing an embodiment of a thin-film capacitor according to the present invention.

FIG. 1 shows a structural drawing of an embodiment when thin-film capacitors according to the present invention are integrated and formed on an alumina substrate. In FIG. 1, 101 is an alumina substrate; 102 is a lower electrode formed by vacuum evaporation having a double layer structure of chromium (Cr) and gold (Au); 103 is a first silicon oxide film formed by a chemical vapor-phase deposition method; 104 is a second silicon oxide film formed by coating on the first silicon oxide film a solution state silicon oxide precursor followed by denaturing by heat treatment; 105 is a third silicon oxide film formed by a chemical vapor-phase deposition method; 106 is an upper electrode having a double layer structure of Cr and Au.

Each of these films in the present embodiment has the thickness as shown in the following: the alumina substrate: 250 $\mu$m; the Cu and Au layers of the lower electrode: 100 Å and 3000 Å respectively; the first silicon oxide layer: 5000 Å; the second silicon oxide layer: 2000 Å; the third silicon oxide layer: 5000 Å; the Cr and Au layers of the upper electrode: 100 Å and 3000Å respectively.

Following is the description on the manufacturing method of the capacitor in the present embodiment. At first, the films of Cr and Au whose thicknesses are specified respectively are formed on the alumina substrate by vacuum evaporation. These metal layers are thin, so that if there is an unevenness of the substrate surface, the metal layers are formed analogously to the unevenness (refer to FIG. 1). The metal layers are patterned to be the lower electrode of the thin-film capacitor by ordinary photolithography and etching technics. The first silicon oxide film is deposited by making silane (SiH$_4$) react with oxygen on the substrate at a substrate temperature of 320° C. by a chemical vapor-phase deposition method. Next, ester silicate (Si(OR)$_4$) (R: alkyl group) alcohol solution is applied with a spinner. Since this is in the state of a solution, even though there is a large hollow on the substrate, and consequently a large hollow on the lower electrode and on the first silicon oxide film formed analogously to the hollow on the substrate, the solution levels up the hollow (refer to FIG. 1). After the solution is applied to form a film, it is heat-treated in an atmosphere of 500° C. for an hour to form the second silicon oxide film by denaturing ester silicate to silicon oxide and to remove the solvent. The third silicon oxide film is deposited at a substrate temperature of 320° C. by a chemical vapor-phase deposition method. A silicon oxide film which is not needed for forming the thin-film capacitor is removed by photolithography and etching technics. Buffered hydrofluoric acid is used as an etchant. A Cr and Au electrode is formed by a vacuum evaporation method so that a Cr film and an Au film may have specified thickness respectively, and then it is formed into the upper electrode for the thin-film capacitor by photolithography and etching technics.

Embodiment 2

Figure 2:
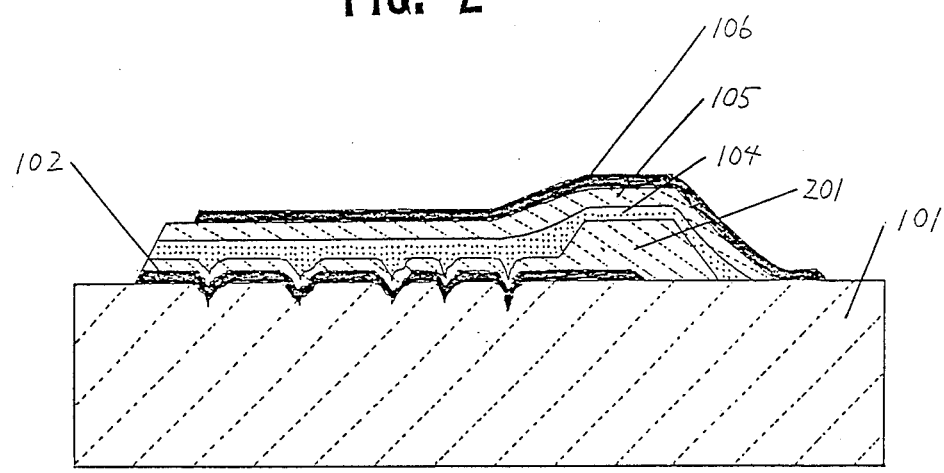
FIG. 2 a structural drawing showing another embodiment of a thin-film capacitor.

FIG. 2 shows a structure of a second embodiment according to the present invention. In FIG. 2, 101 is an alumina substrate; 102 is a lower electrode formed by vacuum evaporation, and it has a double layered structure of Cr and Au; 201 is a first silicon oxide film formed by a chemical vapor-phase deposition method but it is different from that in the first embodiment such that the film thickness at the part (electrode step part) where an upper electrode overlaps an edge of the lower electrode is made thicker; 104 is a second silicon oxide film formed with a coating film of a solution state silicon oxide precursor denatured by heat treatment; 105 is a third silicon oxide film formed by a chemical vapor-phase deposition method; 106 is an upper electrode of a thin-film capacitor having a double layered structure of Cr and Au.

The manufacturing method is the same as that of the first embodiment except the process of photolithography and etching after the formation of the first silicon oxide film.

In this embodiment, the thickness of the first silicon oxide film at the electrode step part is made thick. For example in this embodiment, the thickness of the first silicon oxide film is made to be 1.5 $\mu$m when it is deposited, and the step part of the electrode is masked with a photoresist and the other part of the film is thinned keeping the thickness of the film at the part masked with the photoresist unchanged. For example, in this embodiment the thickness is made to be 5000 Å. The other steps of the manufacturing process are the same as those of the embodiment 1. The thickness of the second silicon oxide film and the third silicon oxide film are 2000 Å and 5000 Å respectively. Therefore the thickness of the first silicon oxide film at the electrode step part is 2.2 $\mu$m, and that of the other part which works as a capacitor is 1.2 $\mu$m.

The following samples were tested for comparison of the withstand voltage characteristics, the yield on withstand voltage tests and the dielectric loss characteristics: the capacitors obtained in the embodiment 1 and the embodiment 2; capacitors whose dielectric film was formed only by a silicon oxide film which was formed by the heat treatment of a coating film of a solution state silicon oxide precursor (comparison example 1); capacitors whose dielectric film was formed only by a chemical vapor-phase deposition method (comparison example 2); capacitors whose dielectric film did not have the first silicon oxide film (comparison example 3). In every case, the film thickness was set to have the same value of 1.2 $\mu$m. In the case of the comparison example 3, the thickness of a silicon oxide film obtained by heat treatment of a coating film of a solution state silicon oxide precursor was set to be 2000 Å. In the embodiment 2, the thickness of the film at the electrode step part was made to be 2.2 $\mu$m for the width of 20 $\mu$m. The area of a film which works as a capacitor was made to be a square of 600 $\mu$m $\times$ 600 $\mu$m. The test results are shown in Table 1.

TABLE 1

Comparison of characteristics of various kinds of thin-film capacitors

|  | Dielectric loss (1 MHz) | Production yield on withstand voltage characteristics (20 VDC) |
| --- | --- | --- |
| Embodiment 1 | 0.001 | 91% |
| Embodiment 2 | 0.001 | 99% |
| Comparison Example 1 | 1.0 | 54% |
| Comparison Example 2 | 0.05 | 9% |
| Comparison | 0.05 | 51% |

TABLE 1-continued

Comparison of characteristics of various kinds of thin-film capacitors

|  | Dielectric loss (1 MHz) | Production yield on withstand voltage characteristics (20 VDC) |
| --- | --- | --- |
| Example 3 | | |

In Table 1, the values of dielectric loss are those at the frequency of 1 MHz. The yield on the withstand voltage tests expresses the percentage values of the number of the qualified capacitors when 100 pieces of thin-film capacitors are formed and 20 VDC is applied on them.

In the case of the embodiment 1, the dielectric loss characteristic and the yield on withstand voltage tests are much improved in comparison with the comparison examples. In comparison with the comparison example 1, the improvement in the dielectric loss characteristic is remarkable. In comparison with the comparison example 2, the improvement in the yield on the withstand voltage tests is remarkable. In the case of the constitution of the embodiment 2, the yield on the withstand voltage tests is improved in comparison with the case in the embodiment 1. For the samples which have good withstand voltage characteristics, dielectric breakdown voltages were measured. In the case of the embodiment 1 the breakdown voltages were 100 -120 VDC, in the case of the embodiment 2 they were 120 -150 VDC. In the comparison example 1 the breakdown voltages were in the range of 80-110 VDC, in the comparison example 2 they were so low as 30-50 VDC, and in the comparison example 3 they were 80-100 VDC; thus in the above cases the values of dielectric breakdown voltages are inferior to those of the embodiment 1 and the embodiment 2.

When the whole dielectric layer is constituted with a silicon oxide layer which is formed by heat treatment of a coating film of a solution state silicon oxide precursor, the Withstand voltage characteristic and the yield on the withstand voltage tests are good, but the dielectric loss characteristic is very bad. The reason is that the film made by heat treatment of a coating film of a solution state is not substantially fine, and a film constituted mainly with silicon dioxide having a small number of lattice defects cannot be obtained by a method in which an organic compound is denatured to inorganic silicon oxide. Because of this, a silicon oxide film with good dielectric loss characteristic cannot be obtained by a method as mentioned in the above.

In contrast to this, a film formed by a chemical vapor-phase deposition method is a polycrystalline sintered body constituted mainly with silicon dioxide, which has a small number of lattice defects, so that a capacitor with such a dielectric film has an excellent dielectric loss characteristic. On the other hand, such a film is deposited faithfully along the surface of a substrate, so that it does not contribute for leveling up of the unevenness on the surface of the substrate; therefore the withstand voltage characteristic and the yield on the withstand voltage tests are not good enough.

The constitution in the comparison example 3 has both merits, one in the comparison example 1 and the other in the comparison example 2, but when it is compared with the embodiment 1 and the embodiment 2, its characteristics are inferior to those of the embodiments 1 and 2 on the whole, and also it is inferior to the embodiments 1 and 2 in the stability for a long time, that is, in the reliability. A life test in an environment of high humidity and high temperature was executed at 80° C. and in a relative humidity of 95%. The results showed that the capacitors having the constitution as shown in the embodiment 1 or the embodiment 2 have the change rate in dielectric loss less than 10%, but the capacitors having the constitution as shown in the comparison example 3 showed the change rate of more than 20%. In the constitution as shown in the embodiments 1 and 2, both of the upper and lower electrodes border on chemically stable silicon oxide layers formed by a chemical vapor-phase deposition method. On the contrary in the constitution as shown in the comparison example 3 the electrode borders on a silicon oxide film formed by heat treatment of a coating film of a solution state silicon oxide precursor, which is not stable enough and is not substantially fine, so that it can be considered that at the interface between the electrode and the unstable silicon oxide film chemical changes are apt to occur, which may cause the change in characteristics.

In the comparison example 3, there is also a problem in the manufacturing process. Etching does not proceed uniformly for a silicon oxide film formed by heat treatment of a coating film of a solution state silicon oxide precursor, so that unevenness of etching often occurs. When the film is placed between the silicon oxide films each formed by a chemical vapor-phase deposition method, the unevenness of etching speed for the film formed by heat treatment can be absorbed considerably because the etching speed for the film formed by a chemical vapor-phase deposition is fairly slow, so that the manufacturing process can be stabilized, The constitution as shown in the embodiment 2 is effective especially for a capacitor which has a large electrode step part, that is, a large electrode area (for example a bypass capacitor), or for a capacitor in which the loss in an electrode itself is a problem and the thickness of the lower electrode is desired to be increased (for example an input/output impedance matching capacitor for a high efficiency amplifier).

In the above embodiments gold and chromium are used for an electrode, but the electrodes simply constitute the opposing electrodes of a thin-film capacitor, so that the materials for electrodes are not limited to these materials, and titanium, platinum or palladium can also be used In the above embodiments, a specific thickness is used as the thickness of an electrode, but as far as it functions as an electrode in a high frequency band, its thickness is not limited to a specific dimension In the above embodiments, a specific thickness is used as the thickness of each silicon oxide film, but as far as a specified static capacitance is obtained and a satisfactory withstand voltage characteristic and a value of production yield are obtained, the film thickness is not limited to the thickness used in the above embodiments.

In the above embodiments, ester silicate is used as a solution state silicon oxide precursor, but what is intended in the present invention is to level up the unevenness on the surface of a substrate by applying a material in a solution state over it. Therefore the material is not limited to the one used in the above embodiments as far as it can be changed to silicon oxide after application.

In the above embodiments, a solution state silicon precursor is applied with a spinner and the film thickness of 2000 Å is obtained at a rotational speed of 1000 rpm, but as far as a solution can be applied thinly and uniformly other methods can be used.

In the above embodiments, the heat treatment is executed at 500° C. for an hour. However, it was found, through the comparison study in which heat-treatment temperature was varied, that the similar effect can be obtained in the temperature range of 350-650 ° C. When the temperature was lower than 350° C. there was almost no improvement in the dielectric characteristic of a silicon oxide film formed by a chemical vapor-phase deposition method. When the temperature was higher than 650° C. damages occurred at the lower electrode. When the period of time for heat treatment exceeded 10 minutes it was effective, but when the period of time exceeded 5 hours further effect of improvement was not observed. These results show that an effective condition of heat treatment is 350-650 ° C., 10 minutes - 5 hours, and the optimum condition is 500° C., 1 hour. It is necessary that an atmosphere for heat treatment contains at least oxygen.

In the above embodiments, an alumina substrate is used, but it will be clear from the principle that the effect of the present invention can be obtained by using other ceramic materials such as single crystalline substrates having some unevenness on the surfaces or metallic substrates.

The chemical vapor-phase deposition in the above embodiments is done under a reduced pressure (lower than normal atmosphere) at a substrate temperature of 320° C. When a chemical vapor-phase deposition method is used, even if conditions are different to a degree, similar silicon oxide film quality to each other is obtained. Thus, the manufacturing condition is not limited to that in the above embodiments. It is not preferable to apply a temperature exceeding 400° C. for a long time because the lower electrode can be damaged.

The dielectric loss of capacitors in the embodiments 1 and 2 at 14 GHz was measured by a resonance method of a microstrip line. In both cases, the values were less than 0.01. It is therefore confirmed that the capacitors have good dielectric loss characteristics in a microwave frequency band.

Embodiment 3

Figure 3:
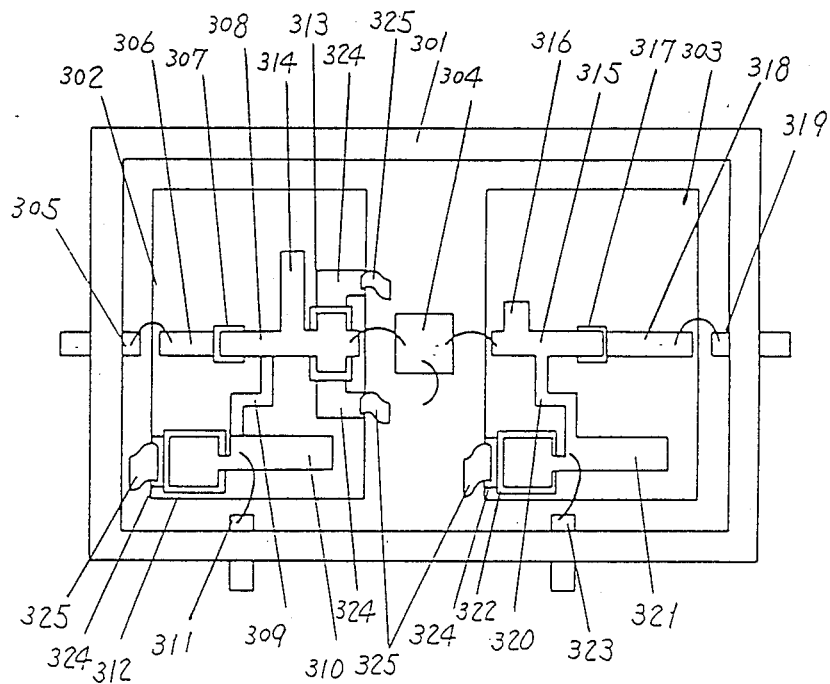
FIG. 3 a structural drawing showing an embodiment of a hybrid microwave integrated circuit using thin-film capacitors according to the present invention.

FIG. 3 is a constitutional drawing of a hybrid microwave integrated circuit using thin-film capacitors described in the embodiments 1 and 2. In FIG. 3, 301 is a package for the circuit; 302 is an input side alumina substrate having an electrode to be grounded on the back of the substrate; 303 is an output side alumina substrate having an electrode to be grounded on the back of the substrate; 304 is a gallium arsenide (GaAs) field effect transistor (FET); 305 is an input terminal; 306 is an input side microstrip line; 307 is a DC blocking capacitor for input coupling; 308 is a gate side microstrip line; 309 is a thin-film resistor for supplying a gate bias voltage; 310 is a ¼ wavelength open end microstrip line; 311 is a gate bias voltage supplying terminal; 312 is a gate bias voltage bypass capacitor; 313 is an input impedance matching capacitor; 314 is an open stub for input impedance matching; 315 is a drain side microstrip line; 316 is an open end microstrip line for output impedance matching; 317 is a DC blocking capacitor for output coupling; 318 is an output side microstrip line; 319 is an output terminal; 320 is a ¼ wavelength microstrip line for supplying a drain voltage; 321 is a ¼ wavelength open stub; 322 is a drain bias voltage bypass capacitor; 323 is a terminal for supplying a drain bias voltage; 324 is a lower electrode of a thin-film capacitor and it is connected to the package via a gold ribbon 325 and is grounded. Couples of parts as shown in the following are connected by wires respectively: the input terminal and the input side microstrip line, the output terminal and the output side microstrip line, the gate bias voltage supplying terminal and the gate bias voltage bypass capacitor, the drain bias voltage supplying terminal and the drain bias voltage bypass capacitor, the input impedance matching capacitor and the FET gate electrode, the drain side microstrip line and the FET drain electrode, the FET source electrode and the earth potential (package).

In the present embodiment, the input and output coupling thin-film capacitors and the input impedance matching thin-film capacitors are of the type described in the embodiment 1. Each bypass thin-film capacitor is of the type described in the embodiment 2.

Figure 4:
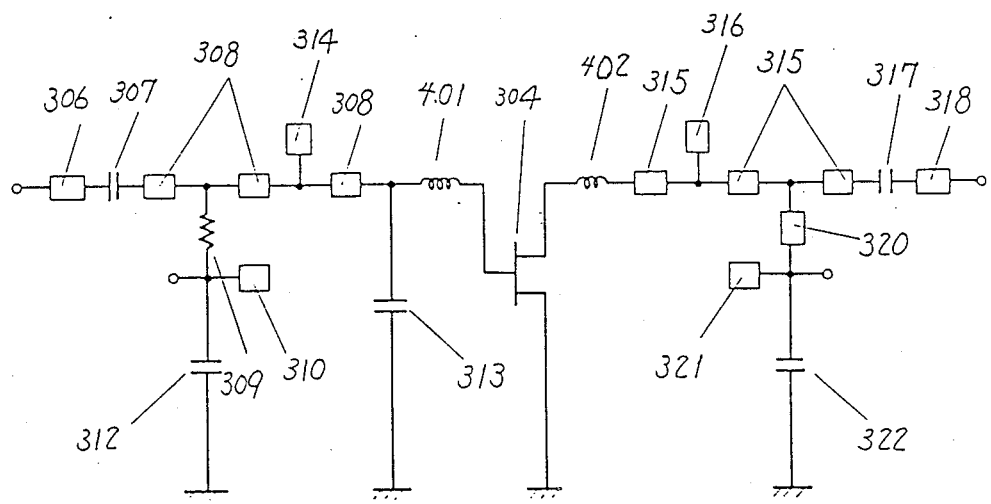
FIG. 4 shows an equivalent circuit of the embodiment shown in FIG. 3.

FIG. 4 shows an electrical equivalent circuit of the constitution shown in FIG. 3. In FIG. 4 microstrip lines and various stubs are expressed with rectangles. Each number corresponds to the number shown in FIG. 3. The part number 401 is an inductance caused by the gate connecting wire, and 402 is an inductance caused by the drain connecting wire. In this circuit diagram an inductance at the source side is neglected. Substantial input/output impedance matching is done by the input impedance matching capacitor 313. The input circuit and the transistor section, and the output circuit and the transistor section are coupled for a high-frequency voltage but separated for a DC voltage by the input coupling and DC blocking thin-film capacitor 307 and the output coupling and DC blocking thin-film capacitor 317 respectively. Bias voltage bypass thin-film capacitors 312 and 322 are connected to the gate bias voltage supply point and to the drain bias voltage supply point respectively to prevent high frequency signals from entering into the power supply circuit. In this case, various kinds of thin-film capacitors are arranged to form a unity not to necessitate wired connections, and the preciseness of their dimensions depends on the preciseness of photolithography. The preciseness of photolithography can be easily made to the order of 1 $\mu$m, so that the reproducibility of characteristics is excellent in comparison with that of a circuit connected with wires.

In the following the manufacturing method of the microwave integrating circuit will be described.

At first, a tantalum nitride film of a specified thickness is formed on an alumina substrate by sputtering; resistors in a gate bias voltage section are formed by etching the tantalum nitride film with ordinary technics of photolithography and etching; double layered electrodes of Cr and Au are formed with ordinary technics of vacuum evaporation, photolithograpyy and etching as lower electrodes of various kinds of thin-film capacitors; input/output coupling and DC blocking thin-film capacitors and input impedance matching thin-film capacitors are formed by the method shown in the embodiment 1, and bypass capacitors are formed by the method shown in the embodiment 2. To be concrete, after the lower electrodes are formed, a silicon oxide film of specified thickness (as an example, 1.5 $\mu$m) is formed by a chemical vapor-phase deposition method at a substrate temperature of 320° C. using $SiH_4$ and oxygen as a raw material. After that, the parts of the film at the electrode step parts are formed for input/output coupling and DC blocking thin-film capacitors, input impedance matching thin-film capacitors and bypass thin-film capacitors are not etched and left as they are, and other parts are etched to be a specified thickness (for example 1500 Å). Over the above-mentioned film, a silicon oxide film (for example 2000 Å) of coating type used in the embodiments 1 and 2 is formed; heat treatment is done in the air for 1 hour at 500° C. Next, a silicon oxide film of a specified thickness (for example 1500 Å) is again formed by a chemical vapor-phase deposition method at a substrate temperature of 320° C. with $SiH_4$ and oxygen as raw materials. The parts of the film for the thin-film capacitors are left without being etched and other parts are removed by the technics of photolithography and etching, and then double layered metallic films of Cr and Au are formed as upper electrodes of the thin-film capacitors, microstrip lines and bias voltage supply parts with the technics of ordinary vacuum evaporation, photolithography and etching. When a thick metallic film is needed gold plating is done after a vacuum evaporation process. The film thicknesses of the thin-film capacitors thus obtained are respectively 1.85 μm for the coupling capacitors and the matching capacitors, and 5000 Å for the bypass capacitors. When the thickness of each film is as described in the above, the area of each capacitor is set so that the capacitance cf each capacitor is as follows: the coupling capacitor is 2 pF, the matching capacitor is 1 pF and the bypass capacitor is 45 pF. The area of the bypass capacitor, which has the largest size, is about 800 μm×800 μm. In the present embodiment, the electrode area of the bypass capacitor is the largest and its film thickness is the thinnest, so that the short circuit as an electrode step part is a problem. That is the reason why the constitution shown in the embodiment 2 is adopted for the bypass capacitor. With this arrangement without increasing the process of a chemical vapor-phase deposition, the thickness of the bypass capacitor which requires a large capacitance can be made thinner than the thickness of other capacitors.

In the present embodiment, chemical vapor-phase deposition is performed under reduced pressure (below normal atmospheric pressure); owing to this a silicon oxide film Of good characteristics is obtained at a substrate temperature of 320° C. It is not preferable to raise the substrate temperature higher than 400° C., because a lower electrode can' be damaged or the resistance value of a tantalum thin-film resistor may be varied by the influence of heat.

As the conditions for heat treatment, the same conditions as those in this embodiment 1 are effective, the most favorable conditions are also the same as those in the embodiment 1, 500° C., 1 hour.

By the adoption of the constitution and the manufacturing method as shown in the present embodiment, the following advantages can be obtained.

(1) thin-film capacitors of excellent withstand voltage characteristics and dielectric loss characteristics can be formed on an alumina substrate with good yield to make an integrated circuit;

(2) on a substrate various kinds of capacitors can be formed in a unity, which helps the improvement cf the degree of integration and miniaturization; the labor for assembling with wire bondings and for adjustment is much decreased to lower the manufacturing cost; wires for connections are eliminated and parasitic reactance is decreased, which improves the high frequently characteristics (band width etc.); the number of points of wire bondings is decreased and glued points of chip parts are eliminated, so that the reliability for mechanical, thermal changes is improved;

(3) thin-film capacitors of different film thickness can be formed simultaneously without increasing the process of chemical vapor-phase deposition by the manufacturing method shown in the present embodiment;

(4) by leaving the first silicon oxide film produced by a chemical vapor-phase deposition method on a substrate, the denaturing of a lower electrode and thin-film resistors caused by heat treatment of a coating type silicon oxide film can be prevented; the heat treatment at a higher temperature is made possible; a coating type silicon oxide film is not directly in contact with an electrode, which increases the reliability of the electrode; the coating type silicon oxide film is interposed between silicon oxide films each formed by a chemical vapor-phase deposition, which suppresses the dispersion of etching speed in the last etching process.

The operating voltage of a GaAs FET is 5–10 V, and so there is no problem concerning the withstand voltage in the thin-film capacitor having the withstand voltage of 100 V.

In the present embodiment, thin-film resistors of tantalum nitride are used in the gate bias voltage supply point; thin-film resistors of other materials can also be used.

In the present embodiment, an alumina substrate is used as a substrate but the material is not limited to alumina, a substrate of other ceramics such as beryllia (BeO) or silicon carbide can be used. Cr and Au are used for the electrode, but the materials for the electrode are not limited to these.

In the present embodiment, gold ribbons are used for the grounding of bypass thin-film capacitors for bias voltage and of input impedance matching thin-film capacitors, but the grounding method is not limited to the one mentioned in the above, any method which has small parasitic inductance can be adopted.

What is claimed is:

1. A thin-film capacitor formed on a polycrystalline sintered body substrate and comprising a lower electrode, a dielectric film and an upper electrode, said dielectric film having a three layered structure comprising a first silicon oxide film formed by a chemical vapor-phase deposition method, a second silicon oxide film formed by coating on the first silicon oxide film a solution state silicon oxide precursor followed by denaturing by heat treatment, and a third silicon oxide film formed on the second silicon oxide film by a chemical vapor-phase deposition method.

2. A thin-film capacitor according to claim 1, wherein ester silicate is used as the solution state silicon oxide precursor.

3. A thin-film capacitor according to claim 1, wherein the heat treatment is made in a condition of 350–650° C., 10 minutes - 5 hours.

4. A thin-film capacitor according to claim 1, wherein an alumina substrate is used as the polycrystalline sintered body substrate.

5. A thin-film capacitor according to claim 1, wherein the chemical vapor-phase deposition is performed at a substrate temperature of 400° C. or lower.

6. A thin-film capacitor according to claim 1, wherein the chemical vapor-phase deposition is performed under a reduced pressure (lower than normal pressure), at a substrate temperature of 320° C.

7. A method of manufacturing a hybrid microwave integrated circuit having at least an input/output coupling and DC blocking capacitor, a bypass capacitor and an impedance matching capacitor using a substrate of polycrystalline sintered body, comprising the steps of: forming lower electrodes for the capacitors; forming a first silicon oxide film by a chemical vapor-phase deposition method; thinning the first silicon oxide film by the technics of photolithography and etching excluding a part where an edge of a lower electrode and an upper electrode of each capacitor will overlap each other; forming a second silicon oxide film by coating on the first silicon oxide film a solution state silicon oxide precursor followed by denaturing by heat treatment; forming a third silicon oxide film on the second silicon oxide film by a chemical vapor-phase deposition method; removing the film leaving a part for the input/output coupling and DC blocking capacitor, impedance matching capacitor and bypass capacitor; and forming upper electrodes for the capacitors.

8. A method according to claim 7, wherein ester silicate is used as the solution state silicon oxide precursor.

9. A method according to claim 7, wherein the heat treatment is made in a condition of 350–650° C., 10 minutes - 5 hours.

10. A method according to claim 7, wherein an alumina substrate is used as the polycrystalline sintered body substrate.

11. A method according to claim 7, wherein the chemical vapor-phase deposition is performed at a substrate temperature of 400° C. or lower.

12. A method according to claim 7, wherein the chemical vapor-phase deposition is performed under a reduced pressure (less than normal pressure) at a substrate temperature of 320° C.

* * * * *